United States Patent
Gilberton et al.

(10) Patent No.: US 7,580,722 B2
(45) Date of Patent: Aug. 25, 2009

(54) CONTROL OF A POWER AMPLIFIER FOR REDUCING POWER CONSUMPTION IN A TRANSCEIVER

(75) Inventors: Philippe Gilberton, Chantepie (FR); Paul Knutson, Lawrenceville, NJ (US)

(73) Assignee: Thomson Licensing, Boulogne Billancourt (FR)

( * ) Notice: Subject to any disclaimer, the term of this patent is extended or adjusted under 35 U.S.C. 154(b) by 58 days.

(21) Appl. No.: 10/589,167

(22) PCT Filed: Feb. 9, 2005

(86) PCT No.: PCT/EP2005/050581

§ 371 (c)(1), (2), (4) Date: Aug. 11, 2006

(87) PCT Pub. No.: WO2005/081414

PCT Pub. Date: Sep. 1, 2005

(65) Prior Publication Data

US 2007/0184790 A1 Aug. 9, 2007

(30) Foreign Application Priority Data

Feb. 13, 2004 (EP) ................... 04290406

(51) Int. Cl.
*H04B 7/00* (2006.01)

(52) U.S. Cl. .............. 455/522; 455/127.1; 455/127.2; 455/114.2

(58) Field of Classification Search ......... 455/522, 455/69, 127.1, 114.2, 126, 241.1, 67.13, 455/296, 232.1, 295, 250.1, 114.1, 115, 63.1, 455/73, 115.1
See application file for complete search history.

(56) References Cited

U.S. PATENT DOCUMENTS 5,712,593 A   1/1998   Buer et al.
5,909,642 A * 6/1999   Suzuki ................ 455/114.3

(Continued)

FOREIGN PATENT DOCUMENTS

EP   0928072   7/1999

(Continued)

OTHER PUBLICATIONS

Search Report Dated Apr. 26, 2005.

*Primary Examiner*—Tan Trinh
(74) *Attorney, Agent, or Firm*—Robert D. Shedd; Joseph J. Opalach; Brian J. Cromarty

(57) ABSTRACT

A technique for controlling a transceiver apparatus is useful for reducing power consumption, and may be particularly applicable to mobile transceivers which employ a battery power supply. According to an exemplary embodiment, the transceiver apparatus includes a power amplifier for amplifying a transmission signal. A controller controls the power amplifier based on a power level of third order intermodulation products associated with the power amplifier.

19 Claims, 9 Drawing Sheets

U.S. PATENT DOCUMENTS

| | | | |
|---|---|---|---|
| 6,125,266 A * | 9/2000 | Matero et al. | 455/126 |
| 6,404,824 B1 * | 6/2002 | Bell et al. | 375/297 |
| 6,657,499 B2 * | 12/2003 | Lin | 330/296 |
| 6,912,377 B2 * | 6/2005 | Hayashihara | 455/115.1 |
| 7,107,011 B2 * | 9/2006 | Nakazawa et al. | 455/63.1 |
| 7,289,775 B1 * | 10/2007 | King et al. | 455/126 |
| 2002/0146993 A1 * | 10/2002 | Persico et al. | 455/126 |
| 2003/0137355 A1 * | 7/2003 | Lin | 330/290 |
| 2004/0116083 A1 * | 6/2004 | Suzuki et al. | 455/126 |
| 2004/0171351 A1 * | 9/2004 | Nakazawa et al. | 455/67.13 |
| 2004/0248516 A1 * | 12/2004 | Demir et al. | 455/63.1 |
| 2005/0026564 A1 * | 2/2005 | Haub et al. | 455/67.11 |
| 2006/0040617 A1 * | 2/2006 | Haub et al. | 455/67.13 |

FOREIGN PATENT DOCUMENTS

| | | |
|---|---|---|
| EP | 1124337 | 8/2001 |
| GB | 2389006 | 11/2003 |

* cited by examiner

CONTROL OF A POWER AMPLIFIER FOR REDUCING POWER CONSUMPTION IN A TRANSCEIVER

This application claims the benefit, under 35 U.S.C. § 365 of International Application PCT/EP05/050581, filed Feb. 9, 2005, which was published in accordance with PCT Article 21(2) on Sep. 1, 2005 in English and which claims the benefit of European patent application No. 04290406.0, filed Feb. 13, 2004.

The present invention generally relates to transceiver apparatuses, and more particularly, to a technique for controlling the power consumption of a transceiver apparatus. The present invention may be particularly applicable to mobile transceivers which utilize a battery power supply.

Certain communication standards may support use of a Time Division Duplex (TDD) function which specifies that a signal transmitting mode and a signal receiving mode of a transceiver be performed during separate time intervals. For example, communication standards such as Time Division Code Division Multiple Access (TDCDMA), Time Division and Synchronous Code Division Multiple Access (TD-SCDMA), Hiperlan2, IEEE 802.11a, and/or other standards may use the TDD function. Such communication standards may also use different frequency ranges, as indicated for example in Table 1 below.

TABLE 1

| Communication Standards | Frequency Ranges |
| --- | --- |
| TDCDMA | 1900-1920 MHz or 2010-2025 MHz |
| TDSCDMA | 2010-2025 MHz |
| Hiperlan2 | 5.15-5.35 GHz and 5.47-5.725 GHz |
| IEEE 802.11a | 5.15-5.35 GHz and 5.725-5.825 GHz |

Communication standards such as those shown in Table 1 may also require the use of a power amplifier for signal transmission having a linear relationship between input power and output power. To satisfy this linearity requirement, such amplifiers typically require a high bias current during the transmitting mode, and may therefore consume a relatively large amount of power. For example, a typical power amplifier which delivers a peak output power level of 30 dB with a gain of 20 dB may require a DC bias current of 450 mA during the transmitting mode. This requirement of a high bias current for the power amplifier may significantly increase the overall power consumption of an apparatus during the transmitting mode. For example, with an apparatus such as a mobile transceiver, the peak power consumed by the power amplifier may constitute 70% or more of the total power consumption of the apparatus during the transmitting mode. Accordingly, the power amplifier used for signal transmission may consume a large of amount of power, which may be particularly problematic for portable apparatuses such as mobile transceivers that utilize a battery power supply. Moreover, the power consumption of the power amplifier may also cause the apparatus to generate heat in an undesirable manner.

Accordingly, there is a need for a technique for controlling transceiver apparatuses which avoids the foregoing problems, and thereby reduces power consumption while still satisfying the linearity requirements of the power amplifier. The present invention may address these and/or other issues.

In accordance with an aspect of the present invention, a transceiver apparatus is disclosed. According to an exemplary embodiment, the transceiver apparatus comprises power amplifying means for amplifying a transmission signal. Control means are provided for controlling the power amplifying means based on a power level of third order intermodulation products associated with the power amplifying means.

In accordance with another aspect of the present invention, a method for controlling a transceiver apparatus is disclosed. According to an exemplary embodiment, the method comprises steps of detecting a power level of third order intermodulation products associated with a power amplifier of the transceiver apparatus, and controlling the power amplifier responsive to the detection.

The above-mentioned and other features and advantages of this invention, and the manner of attaining them, will become more apparent and the invention will be better understood by reference to the following description of embodiments of the invention taken in conjunction with the accompanying drawings, wherein.

The exemplifications set out herein illustrate preferred embodiments of the invention, and such exemplifications are not to be construed as limiting the scope of the invention in any manner.

Figure 1:
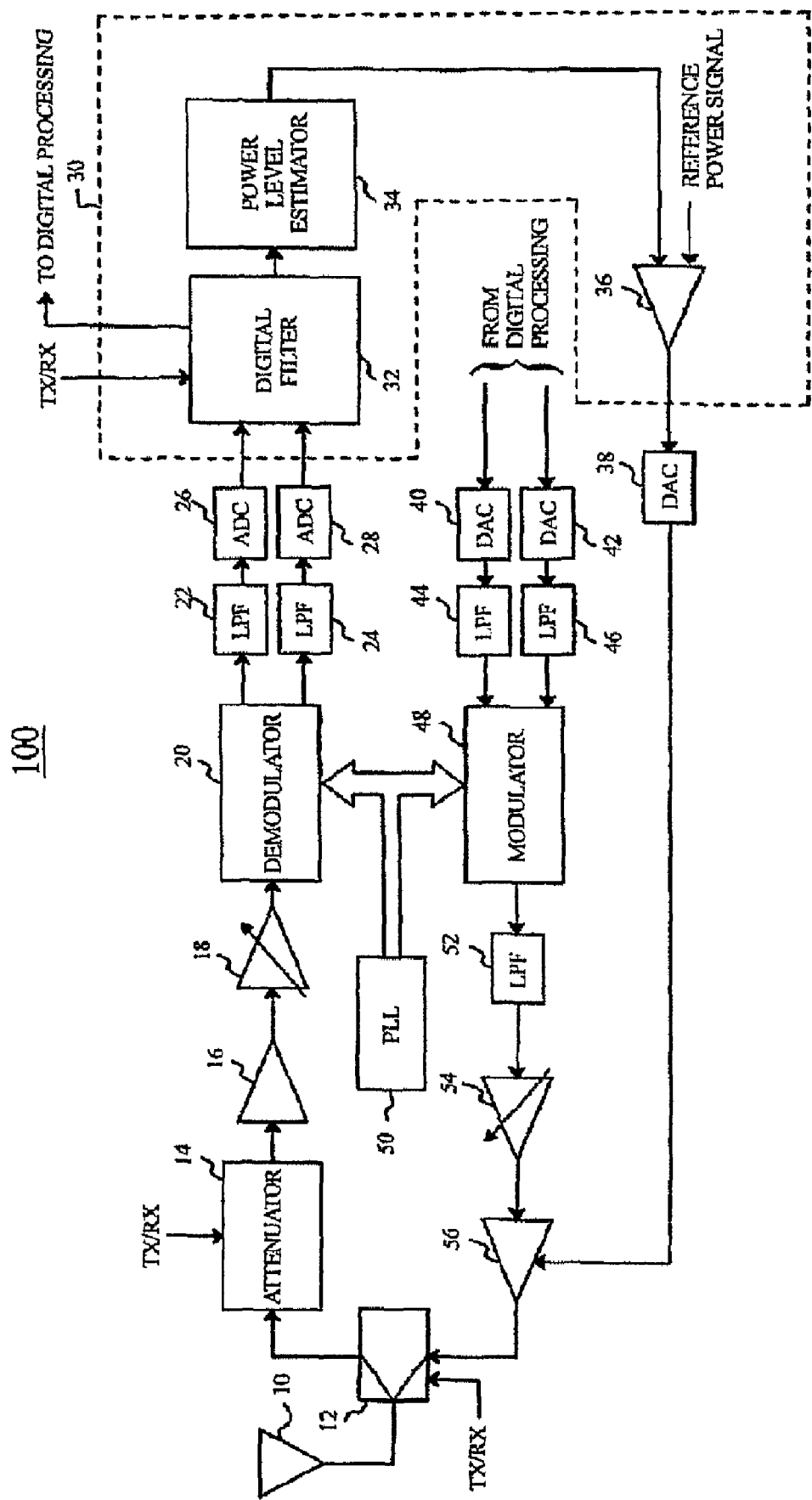
FIG. 1 is a block diagram of a transceiver apparatus according to an exemplary embodiment of the present invention.

Referring now to the drawings, and more particularly to FIG. 1, a transceiver apparatus 100 according to an exemplary embodiment of the present invention is shown. In FIG. 1, transceiver apparatus 100 comprises signal transmitting and receiving means such as signal transmitting and receiving switching means such as switch 12, attenuating means such as attenuator 14, low noise amplifying means such as low noise amplifier (LNA) 16, first variable amplifying means such as variable gain amplifier (VGA) 18, demodulating means such as demodulator 20, first low pass filtering means such as low pass filters (LPFs) 22 and 24, analog-to-digital converting means such as analog-to-digital converters (ADCs) 26 and 28, control means such as controller 30, digital-to-analog converting means such as digital-to-analog converters (DACs) 38, 40 and 42, second low pass filtering means such as LPFs 44 and 46, modulating means such as modulator 48, synchronizing means such as phase locked loop (PLL) 50, third low pass filtering means such as LPF 52, second variable amplifying means such as VGA 54, and power amplifying means such as power amplifier 56. Controller 30 comprises digital filtering means such as digital filter 32, power level estimating means such as power level estimator 34, and comparing means such as comparator 36. Some of the foregoing elements of FIG. 1 may for example be embodied using one or more integrated circuits (ICs). For clarity of description, certain conventional elements associated with transceiver apparatus 100 such as certain control signals, power signals, and/or other conventional elements may not be shown in FIG. 1. Transceiver apparatus 100 may be embodied as a mobile wireless transceiver such as a telephone, pager, personal digital assistant (PDA) and/or other device.

Signal transmitting and receiving 10 is operative to transmit and receive signals, and may be embodied as any type of signal transmitting and receiving element such as an antenna, input/output terminal and/or other element(s). According to an exemplary embodiment, signal transmitting and receiving 10 is operative to transmit and receive signals in a wireless manner.

Switch 12 is operative to switch signals based on a transmitting mode and a receiving mode of transceiver apparatus 100. According to an exemplary embodiment, switch 12 enables the TDD function of transceiver apparatus by providing passage of transmission signals from power amplifier 56 to signal transmitting and receiving 10 during the transmitting mode, and providing passage of received signals from signal transmitting and receiving 10 to attenuator 14 during the receiving mode responsive to a control signal (TX/(RX) provided from a processor (not shown). As will be discussed later herein, leakage signals may pass through switch 12 to signal receiving elements of transceiver apparatus 100 during the transmitting mode. These leakage signals include third order intermodulation products attributable to the non-linear effects of power amplifier 56. These leakage signals are a parasitic effect mainly associated with the parasitic capacitance found between the transmitting and receiving accesses of switch 12, and may be unavoidable in certain frequency ranges. According to an exemplary embodiment, switch 12 applies approximately 30 dB of attenuation to such leakage signals.

Attenuator 14 is operative to attenuate the signals provided from switch 12, and thereby generate attenuated signals. According to an exemplary embodiment, attenuator 14 is operative to provide an additional 30 dB of attenuation during the transmitting mode, and is bypassed during the receiving mode responsive to the TXIRX control signal. The attenuation provided by attenuator 14 during the transmitting mode decreases the level of the leakage signal at the input of LNA 16, and thereby helps avoid any saturation effects thereof.

LNA 16 is operative to amplify the attenuated signals provided from attenuator 14 during the transmitting mode, and to amplify the received signals provided from switch 12 during the receiving mode. VGA 18 is operative to variably amplify the signals provided from LNA 16, and thereby generate amplified signals.

Demodulator 20 is operative to demodulate the amplified signals provided from VGA 18, and thereby generate demodulated signals. According to an exemplary embodiment, demodulator 20 generates demodulated I and Q signals, and may be operative to demodulate signals having a plurality of different types of modulation such as any bi-phase shift keyed (BPSK) modulation, quadrature phase shift keyed (QPSK) modulation, quadrature amplitude modulation (QAM) and/or other types of modulation.

LPFs 22 and 24 are operative to filter the demodulated signals provided from demodulator 20, and thereby generate filtered signals. According to an exemplary embodiment, LPFs 22 and 24 operate as anti-aliasing filters, and filter demodulated I and Q signals, respectively. Also according to an exemplary embodiment, the bandwidth of LPFs 22 and 24 is sufficient to pass the leakage signals going through switch 12 which represents third order intermodulation products attributable to the non-linear effects of power amplifier 56.

ADCs 26 and 28 are respectively operative to convert the filtered signals provided from LPFs 22 and 24 from an analog format to a digital format. According to an exemplary embodiment, the signals provided to ADCs 26 and 28 are scaled by VGA 18 to span the operative ranges of ADCs 26 and 28.

Controller 30 is operative to control power amplifier 56 based on a power level estimation of the third order intermodulation products associated with power amplifier 56. As previously indicated herein, such third order intermodulation products are represented by the leakage signals going through switch 12 during the transmitting mode, and are attributable to the non-linear effects of power amplifier 56. According to an exemplary embodiment, controller 30 processes the leakage signals during the transmitting mode to thereby detect the power level of the third order intermodulation products. Controller 30 compares the detected power level to a power level represented by a predetermined reference power signal, and controls a bias current associated with power amplifier 56 during the transmitting mode based on this comparison. Further details of controller 30 will be provided later herein.

DACs 38, 40 and 42 are operative to convert signals from a digital format to an analog format. According to an exemplary embodiment, DAC 38 is operative to convert digital signals provided from comparator 36 to analog signals which are used to control a bias current associated with power amplifier 56. Also according to an exemplary embodiment, DACs 40 and 42 are respectively operative to convert digitally processed I and Q signals to analog signals. LPFs 44 and 46 are operative to filter the analog signals provided from DACs 40 and 42, respectively, to thereby generate filtered signals.

Modulator 48 is operative to modulate the filtered signals provided from LPFs 44 and 46, and thereby generate modulated signals. According to an exemplary embodiment, modulator 20 is operative to modulate I and Q signals, and may be operative to perform a plurality of different types of modulation such as BPSK modulation, QPSK modulation, QAM and/or other types of modulation. PLL 50 is operative to generate synchronization signals which control demodulator 20 and modulator 48.

LPF 52 is operative to filter the modulated signals provided from modulator 48, and thereby generate filtered signals. VGA 54 is operative to variably amplify the filtered signals provided from LPF 52, and thereby generate amplified signals.

Power amplifier 56 is operative to amplify the power of the signals provided from VGA 54, and thereby generate amplified transmission signals. According to an exemplary embodiment, power amplifier 56 comprises a plurality of cascaded stages, and generally requires linearity between its input power and output power. According to principles of the present invention, a bias current of the final stage of power amplifier 56 may be adaptively controlled during the transmitting mode based on a detected power level of the third order intermodulation products attributable to the non-linear effects of power amplifier 56. By controlling this bias current of power amplifier 56, the present invention may advantageously reduce its power consumption, while also satisfying its linearity requirements in accordance with the applicable output power spectrum mask. Further details of power is amplifier 56 will be provided later herein.

Figure 2:
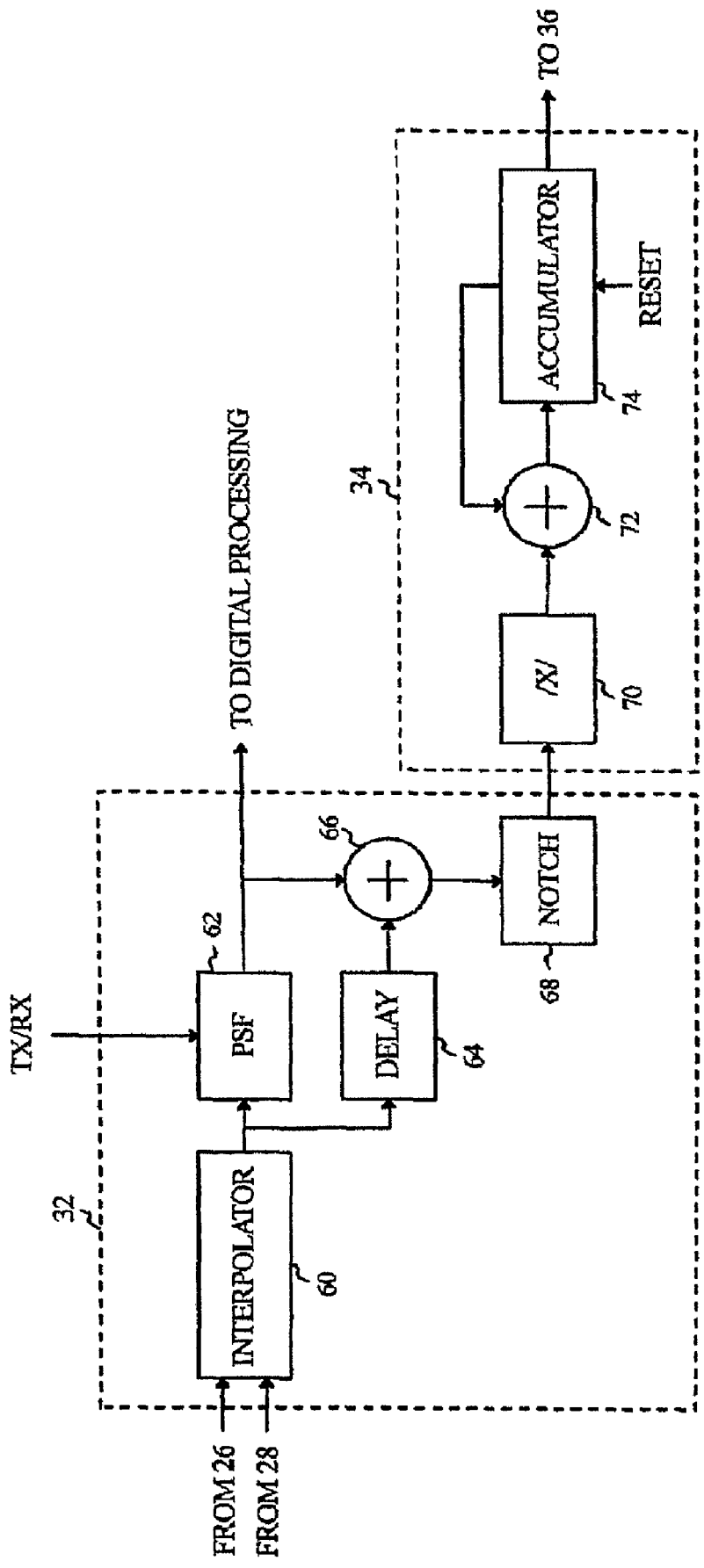
FIG. 2 is a diagram illustrating further exemplary details of the digital filter and power level estimator of FIG. 1.

Referring to FIG. 2, further exemplary details of digital filter 32 and power level estimator 34 of FIG. 1 are provided. In FIG. 2, digital filter 32 comprises interpolating means such as interpolator 60, pulse shaping means such as pulse shaping filter (PSF) 62, delaying means such as delay 64, adding means such as adder 66, and notch filtering means such as notch filter 68. Also in FIG. 2, power level estimator 34 comprises absolute value generating means such as absolute value generator 70, adding means such as adder 72, and accumulating means such as accumulator 74. Some of the foregoing elements of FIG. 2 may for example be embodied using one or more ICs. For clarity of description, certain conventional elements associated with the elements of FIG. 2 such as control signals, power signals, and/or other conventional elements may not be shown in FIG. 2.

Interpolator 60 is operative to perform a symbol time recovery operation using the digital signals provided from ADCs 26 and 28, and thereby generate synchronization information. According to an exemplary embodiment, interpolator 60 outputs such synchronization information along with other digital signals provided from ADCs 26 and 28.

Figure 3:
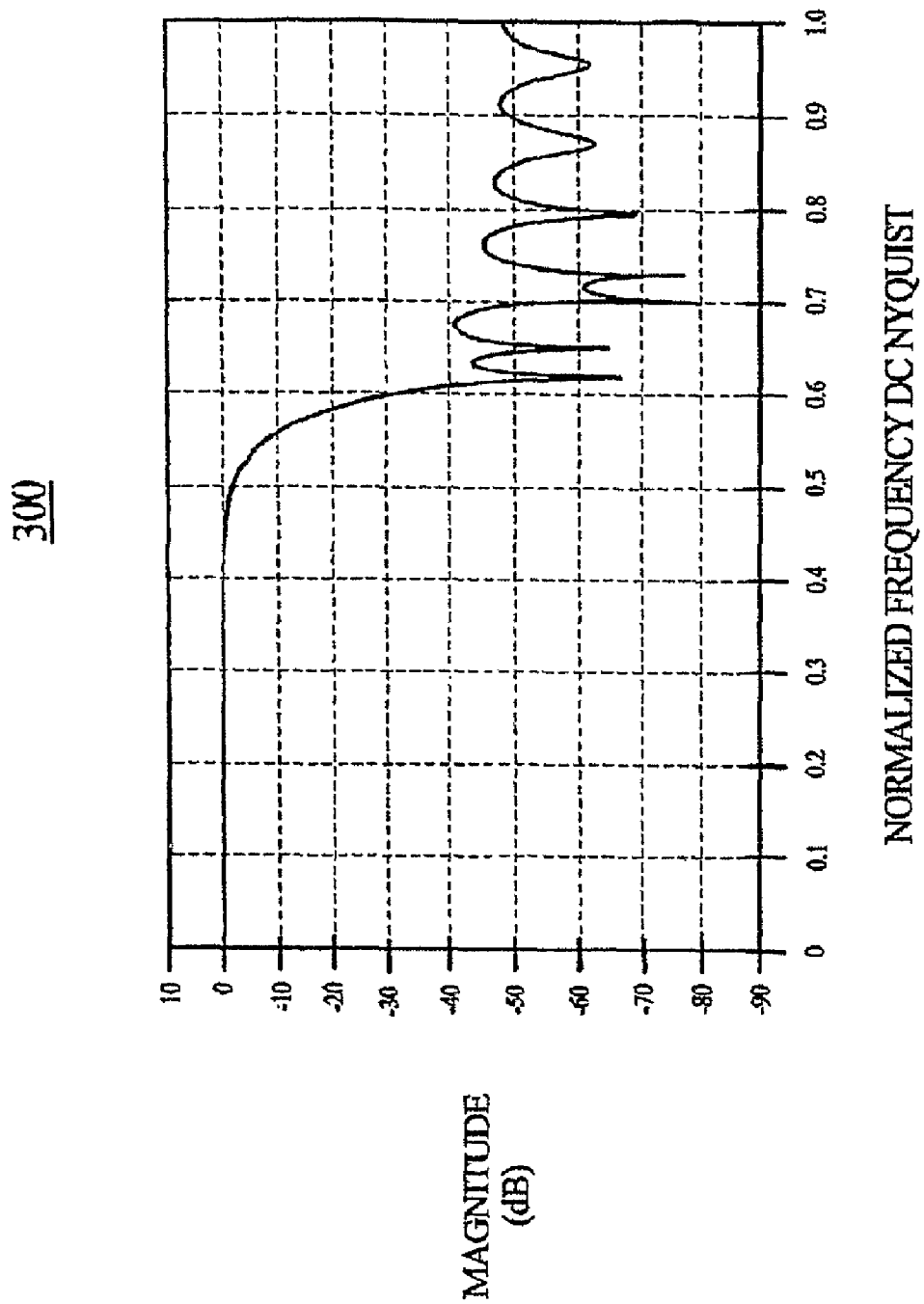
FIGS. 3 to 6 are graphs illustrating exemplary frequency responses associated with the digital filter and power level estimator of FIGS. 1 and 2.
Figure 4:
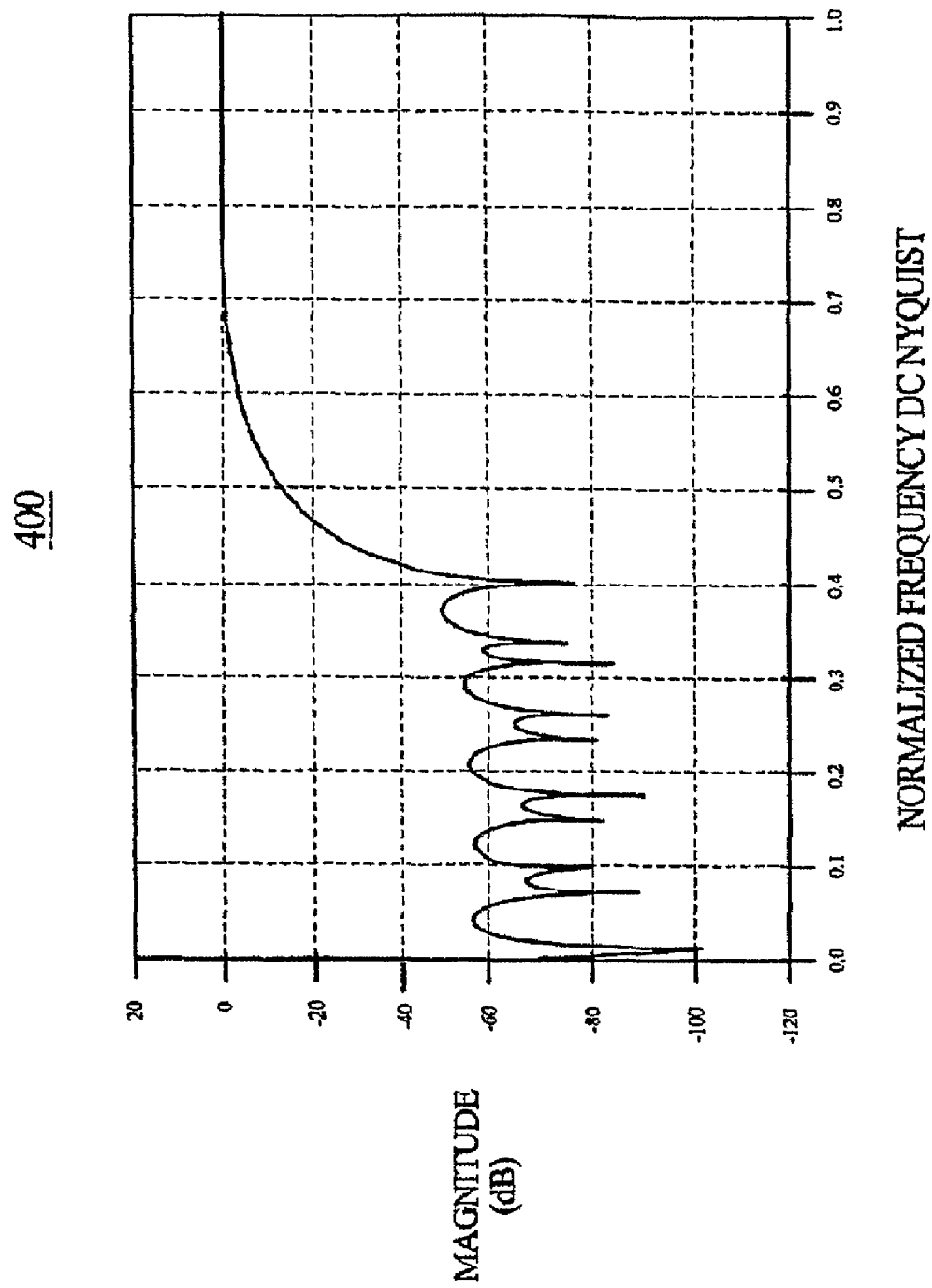

PSF 62 is operative to filter the digital signals provided from interpolator 60, and thereby generate filtered signals. According to an exemplary embodiment, PSF 62 is operative to perform a high pass filtering operation during the transmitting mode, and a low pass filtering operation during the receiving mode responsive to the TX/RX control signal. According to this exemplary embodiment, the high pass filtering operation of PSF 62 has 50 dB of rejection in the frequency band from 0 to 2.5 MHz in order to isolate the leakage signals which represent third order intermodulation products attributable to the non-linear effects of power amplifier 56. In particular, these leakage signals may have significant energy in the frequency band from 2.5 to 5 MHz. During the receiving mode, filtered signals from PSF 62 are provided for additional digital processing as indicated in FIG. 2. PSF 62 may for example be constructed using a raised root cosine filter having a frequency response as represented in graph 300 of FIG. 3. According to an exemplary embodiment, the high pass filtering operation of PSF 62 may be enabled by inverting the raised root cosine filter to thereby produce a frequency response as represented for example in graph 400 of FIG. 4.

Delay 64 is operative to apply a delay to the digital signals provided from interpolator 60, and thereby generate delayed signals. According to an exemplary embodiment, the delay applied by delay 64 is equal to the processing delay created by PSF 62.

Adder 66 is operative to subtract the filtered signals provided from PSF 62 from the delayed signals provided from delay 64, and thereby generate resultant output signals.

Figure 5:
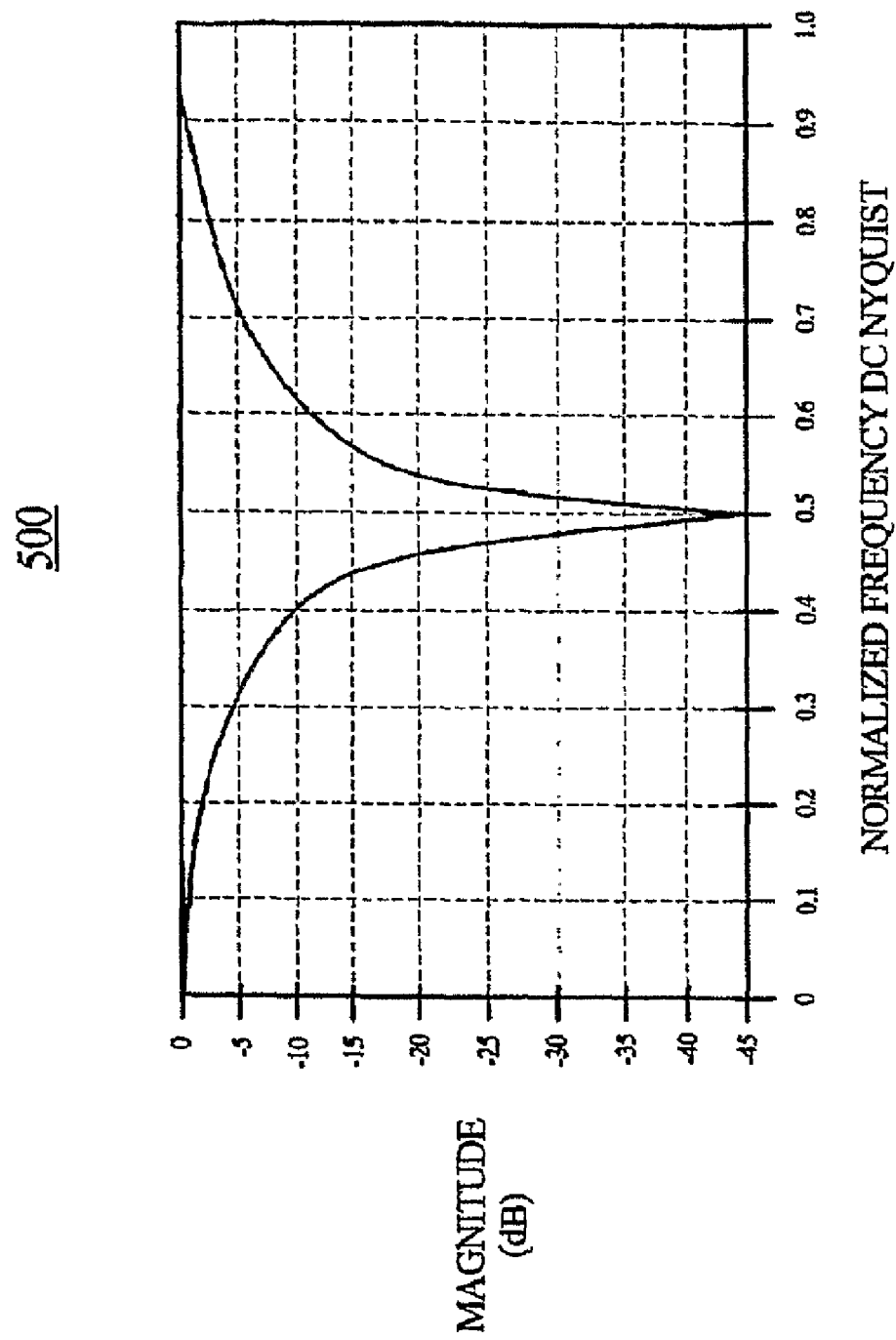
Figure 6:
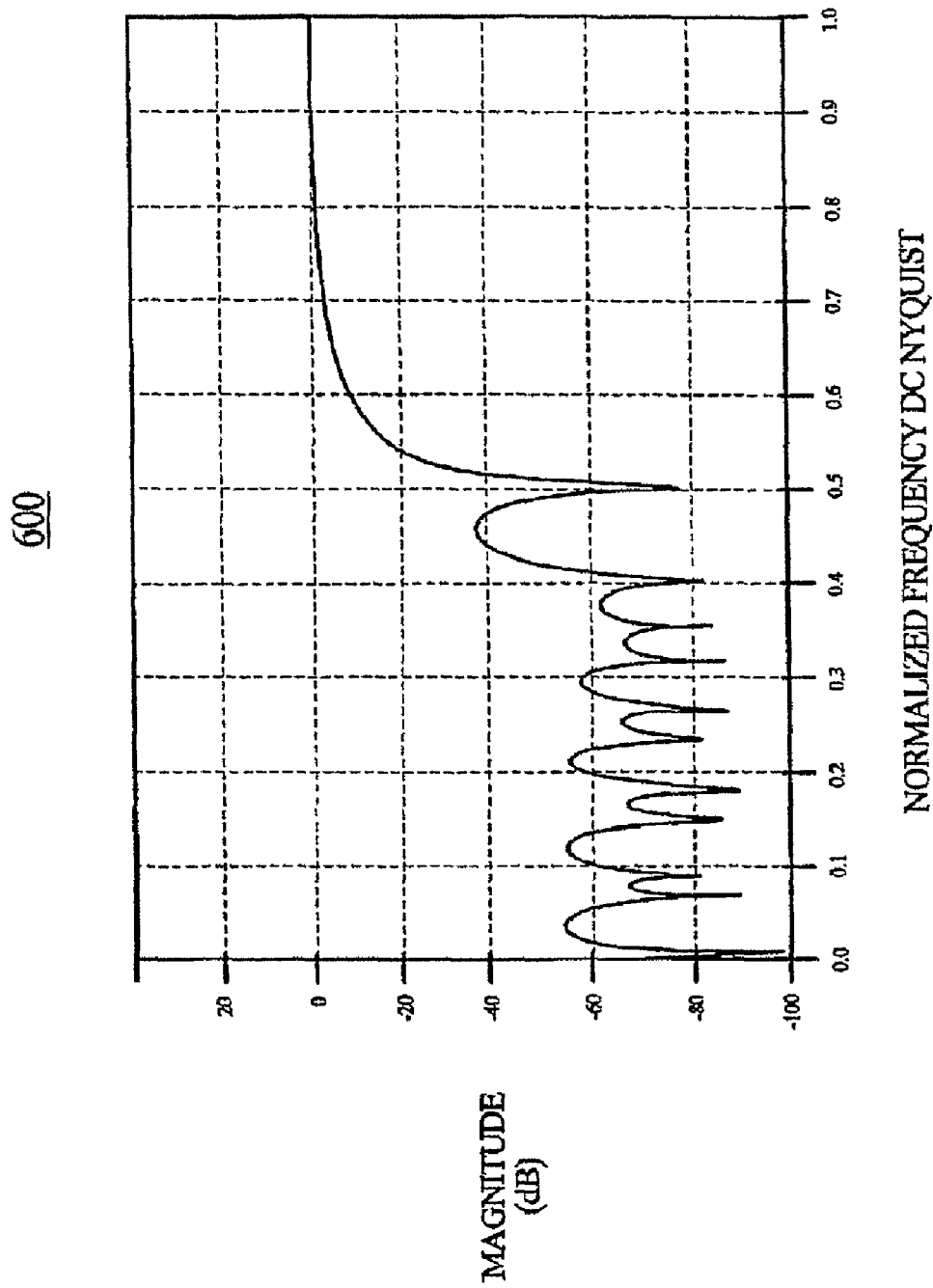

Notch filter 68 is operative to filter the output signals provided from adder 66, and thereby generate filtered signals. According to an exemplary embodiment, notch filter 68 may be constructed using a simple notch filter having coefficients [0.5, 0, 0.5] and a normal frequency response as represented in graph 500 of FIG. 5. According to an exemplary embodiment, the filtered signals generated from the high pass filtering operation of PSF 62 may cause notch filter 68 to produce a cumulative frequency response as represented in graph 600 of FIG. 6.

Absolute value generator 70 is operative to generate absolute value signals from the filtered signals provided from notch filter 68. Adder 72 is operative to add the absolute value signals provided form absolute value generator 70 to output signals from accumulator 74 and thereby generate resultant output signals.

Accumulator 74 is operative to accumulate magnitudes of the output signals provided from adder 72 for predetermined time periods in accordance with a reset signal, and thereby generate resultant output signals. According to an exemplary embodiment, accumulator 74 provides an output signal at the end of each reset period which is an estimate of the power level of the third order intermodulation products attributable to the non-linear effects of power amplifier 56. As indicated in FIG. 2, the output signals from accumulator 74 are provided to comparator 36 (see FIG. 1) which compares the output signals to a predetermined reference power signal. In this manner, a bias current associated with power amplifier 56 may be controlled based on this comparison.

Figure 7:
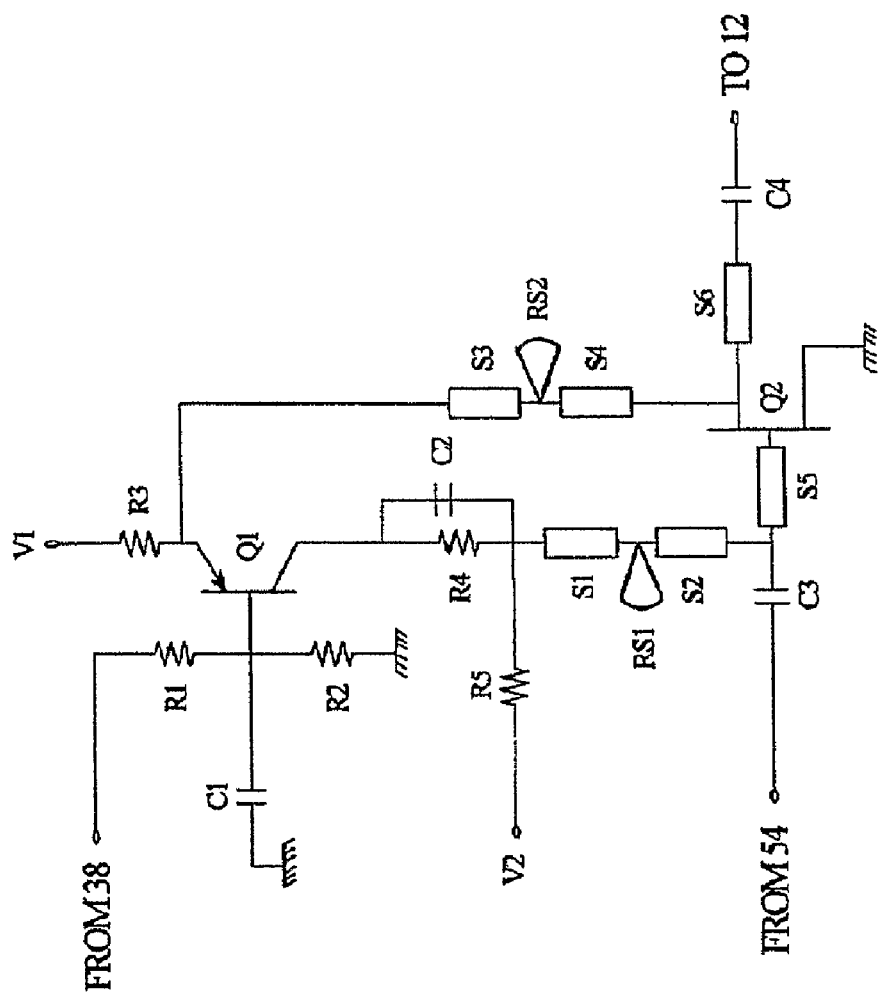
FIG. 7 is a diagram illustrating further exemplary details of the power amplifier of FIG. 1.

Referring now to FIG. 7, further exemplary details of power amplifier 56 of FIG. 1 are provided. In particular, FIG. 7 shows the final stage of a plurality of cascaded stages (e.g., 3 stages) of power amplifier 56 according to an exemplary embodiment of the present invention. In FIG. 7, power amplifier 56 comprises capacitors C1 to C4, transistors Q1 and Q2, radial stubs RS1 and RS2, resistors R1 to R5, quarter wavelength stubs S1 to S6, and voltage inputs V1 and V2. As indicated in FIG. 7, power amplifier 56 also includes input terminals for receiving inputs from DAC 38 and VGA 54, and an output terminal for providing an output to switch 12. According to an exemplary embodiment, transistor Q2 is a field effect transistor (FET) constructed using GaAs. The specific values selected for the elements of power amplifier 56 may be a matter of design choice.

Figure 8:
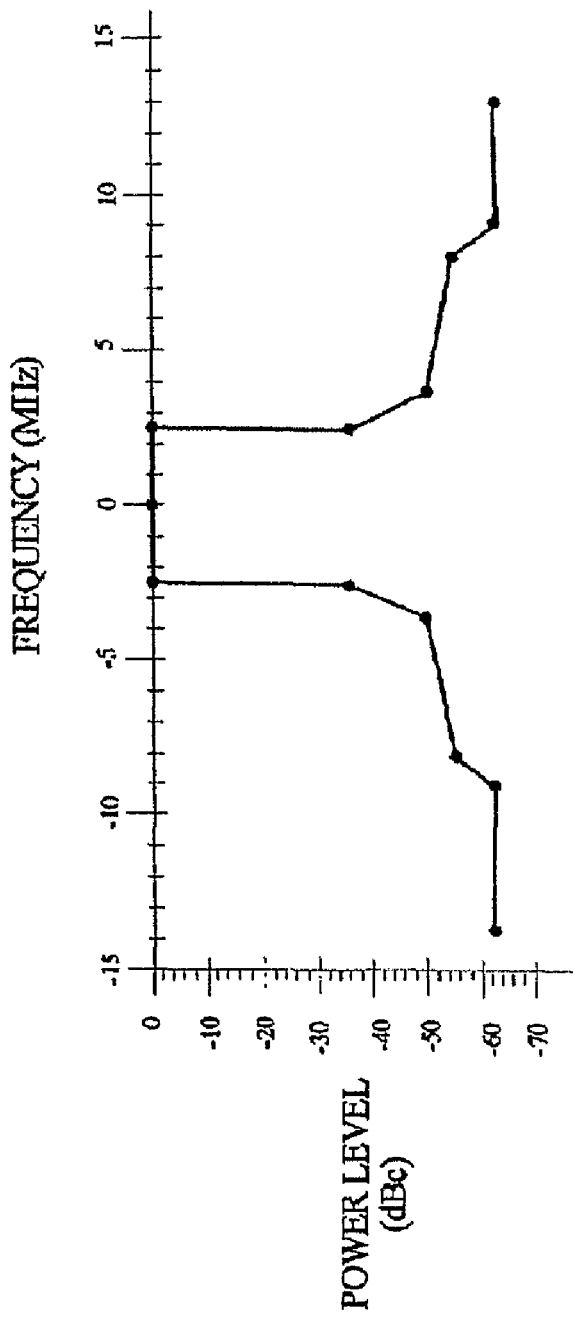
FIG. 8 is a graph illustrating an exemplary output power spectrum mask.

According to principles of the present invention, a bias current of the final stage of power amplifier 56 may be adaptively controlled based on the power level of the third order intermodulation products associated with power amplifier 56. In particular, the analog signal provided from DAC 38 controls the bias current of the final stage of power amplifier 56 based on the comparison made by comparator 36, and thereby defines the operating point of power amplifier 56. In this manner, the operating point of power amplifier 56 may be adjusted so that power consumption is reduced and linearity requirements are satisfied in accordance with the applicable output power spectrum mask. As an example, FIG. 8 is a graph 800 illustrating the output power spectrum mask of the TDCDMA standard.

Figure 9:
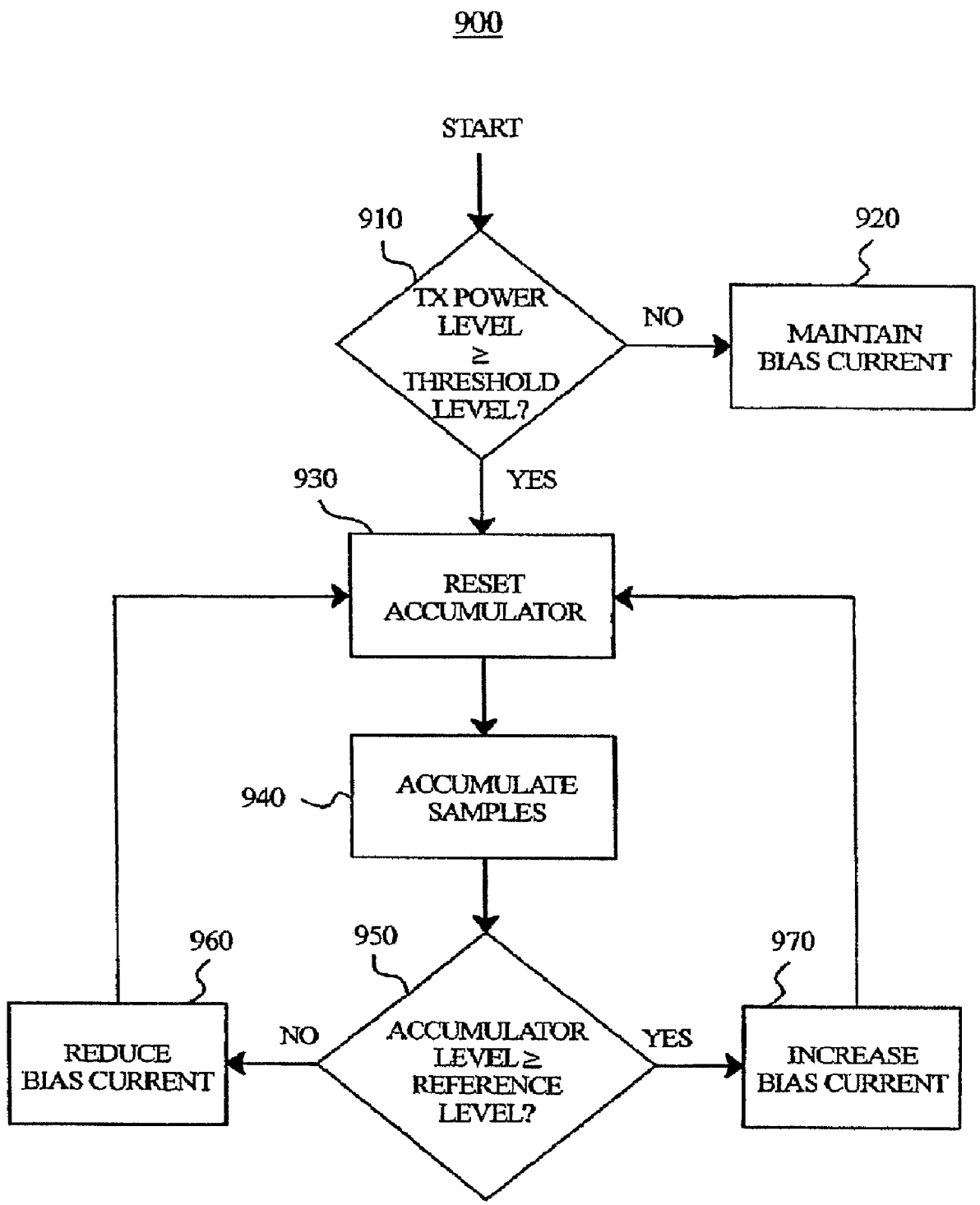
FIG. 9 is a flowchart illustrating steps according to an exemplary embodiment of the present invention.

To facilitate a better understanding of the inventive concepts of the present invention, another example will now be provided. Referring now to FIG. 9, a flowchart 900 illustrating steps according to an exemplary embodiment of the present invention is shown. For purposes of example and explanation, the steps of FIG. 9 will be described with reference to controller 30 of FIGS. 1 and 2 and power amplifier 56 of FIGS. 1 and 7. The steps of FIG. 9 are merely exemplary, and are not intended to limit the present invention in any manner. According to an exemplary embodiment, the steps of FIG. 9 are performed during the transmitting mode of transceiver apparatus 100. When practicing the steps of FIG. 9, it will be intuitive to those skilled in the art that elements of FIGS. 1 and 2 such as attenuator 14 and PSF 62 may be controlled via control signals other than and/or in addition to the TX/RX control signal.

In FIG. 9, process flow starts and advances to step 910 where a determination is made as to whether the transmitting power level of tranceiver apparatus 100 is greater than or equal to a predetermined threshold level. According to an exemplary embodiment, the determination at step 910 may be made by a processor (not shown in FIG. 1) which detects and processes data included within one or more data frames provided during the receiving mode of tranceiver apparatus 100. Also according to an exemplary embodiment, the predetermined threshold level used at step 910 is 27 dBm, although other levels may also be used according to the present invention.

If the determination at step 910 is negative, process flow advances to step 920 where the bias current associated with power amplifier 56 is maintained at its current level. Alternatively, if the determination at step 910 is positive, process flow advances to step 930 where accumulator 74 of power level estimator 34 is reset (see FIG. 2). At step 940, accumulator 74 accumulates magnitude samples for a predetermined time period, and thereafter provides an output signal which is an estimate of the power level of third order intermodulation products attributable to the non-linear effects of power amplifier 56.

At step 950, a determination is made as to whether the estimated power level from accumulator 74 is greater than or equal to a predetermined reference power level. According to an exemplary embodiment, comparator 36 makes the determination at step 950 by comparing the output signal of accumulator 74 to a predetermined reference power signal. If the determination at step 950 is negative, process flow advances to step 960 where the bias current associated with power amplifier 56 is reduced. Alternatively, if the determination at step 950 is positive, process flow advances to step 970 where the bias current associated with power amplifier 56 is increased to thereby increase its linearity.

After steps 960 and 970, process flow loops back to step 930 where the aforementioned steps may be repeated as indicated in FIG. 9. The steps of FIG. 9 may also be performed in an iterative manner such that step 910 is repeated every predetermined time period. Other variations of the steps of FIG. 9 may also be performed according to the present invention. For example, steps 930 to 950 and step 960 or 970 may be performed during every transmitting mode. This variation would enable the bias current of power amplifier 56 to be adjusted regardless of the transmitting power level of tranceiver apparatus 100, and would therefore omit decision step 910. The inclusion of decision step 910, however, may be desirable since the power reduction advantages of the present invention tend to be greater when the transmitting power level of tranceiver apparatus 100 is greater than a given level (e.g., 27 dBm). For example, the steps of FIG. 9 may be capable of reducing the current draw of the final stage of power amplifier 56 by a factor of two (e.g., from 450 mA to 225 mA). In all cases, however, the benefits of power reduction should be weighted by the transmitting mode/receiving mode time ratio.

As described herein, the present invention provides a technique for controlling transceiver apparatuses which advantageously reduces power consumption. Accordingly, the principles of the present invention may be particularly applicable to apparatuses such as mobile transceivers which employ a battery power supply. The reduction of power consumption may also help reduce the generation of undesirable heat by such apparatuses.

While this invention has been described as having a preferred design, the present invention can be further modified within the spirit and scope of this disclosure. This application is therefore intended to cover any variations, uses, or adaptations of the invention using its general principles. For example, the principles of the present invention may be applied to apparatuses or devices which support communication standards other the exemplary standards specifically mentioned herein. Further, this application is intended to cover such departures from the present disclosure as come within known or customary practice in the art to which this invention pertains and which fall within the limits of the appended claims. As such, it is intended that the present invention only be limited by the terms of the appended claims.

The invention claimed is:

1. An apparatus, comprising a receive chain and a transmitting chain, which receives signal and transmits signal during separate time intervals wherein it further comprises:
    power amplifying means for amplifying a transmission signal; and
    control means for controlling said power amplifying means based on a power level estimation of third order intermodulation products associated with said power amplifying means, said intermodulation products being represented by leakage signals going through switch to signal receiving elements during the transmitting mode.

2. The apparatus of claim 1, wherein said control means controls a bias current associated with said power amplifying means.

3. The apparatus of claim 1, further comprising signal transmitting means for wirelessly transmitting said transmission signal.

4. The apparatus of claim 3, further comprising: switching means for providing passage of said transmission signal from said power amplifying means to said signal transmitting means; and wherein a leakage signal associated with said switching means includes said third order intermodulation products.

5. The apparatus of claim 1, wherein: said transceiver apparatus includes a transmitting mode and a receiving mode; and said control means comprises digital filtering means for performing digital filtering operations during both said transmitting mode and said receiving mode.

6. The apparatus of claim 5, wherein said digital filtering means performs a high pass digital filtering operation during said transmitting mode, and performs a low pass digital filtering operation during said receiving mode.

7. The apparatus of claim 1, wherein said control means controls said power amplifying means only if a transmitting power level of said transceiver apparatus exceeds a predetermined threshold level.

8. The apparatus of claim 7, wherein the bias current is maintained at its current level only said transmitting power level of said transceiver apparatus does not exceed said predetermined threshold level.

9. The apparatus of claim 1, wherein control means are set up using a single component such as a controller.

10. The apparatus of claim 1, wherein switching means are set up using a single component such as a switch.

11. A method for controlling a transceiver apparatus, comprising:
    detecting a power level of third order intermodulation products associated with a power amplifier of said transceiver apparatus; and controlling said power amplifier responsive to said detection;
    wherein said detecting is performed during transmission by the transceiver; and
    wherein intermodulation products are represented by leakage signals going through a switch to signal receiving elements during said transmission.

12. The method of claim 11, wherein said controlling step includes controlling a bias current associated with said power amplifier.

13. The method of claim 11, wherein the bias current is reduced if an accumulator level is lower than a reference level and in that the bias current is increased if said accumulator level is higher than said reference level, said accumulator level being an estimate of power level of third order intermodulation products.

14. The method of claim 11, wherein the bias current is modified only if a transmitting power level of said transceiver apparatus exceeds a predetermined threshold level.

15. The method of claim 11, wherein that the bias current is maintained at its current level only if said transmitting power level of said transceiver apparatus does not exceed said predetermined threshold level.

16. The method claim 11, further comprised of: using said power amplifier to amplify a transmission signal; and using a switch to provide passage of said transmission signal from said power amplifier to a signal transmitting element.

17. The method of claim 16, wherein a leakage signal associated with said switch includes said third order intermodulation products.

18. The method of claim 11, further comprised of using said signal transmitting element to wirelessly transmit said transmission signal.

19. The method of claim 11, wherein said detecting and controlling steps are performed if a transmitting power level of said transceiver apparatus exceeds a predetermined threshold level.

* * * * *

UNITED STATES PATENT AND TRADEMARK OFFICE
CERTIFICATE OF CORRECTION

PATENT NO.        : 7,580,722 B2
APPLICATION NO.   : 10/589167
DATED             : August 25, 2009
INVENTOR(S)       : Gilberton et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 72 days.

Signed and Sealed this

Fourteenth Day of September, 2010

David J. Kappos
*Director of the United States Patent and Trademark Office*